United States Patent
Chew et al.

(10) Patent No.: US 9,653,323 B2
(45) Date of Patent: May 16, 2017

(54) MANUFACTURING METHOD OF SUBSTRATE STRUCTURE HAVING EMBEDDED INTERCONNECTION LAYERS

(71) Applicant: ADVANPACK SOLUTIONS PTE LTD., Singapore (SG)

(72) Inventors: Hwee-Seng Jimmy Chew, Singapore (SG); Shoa-Siong Raymond Lim, Singapore (SG)

(73) Assignee: ADVANPACK SOLUTIONS PTE LTD., Singapore (SG)

( * ) Notice: Subject to any disclaimer, the term of this patent is extended or adjusted under 35 U.S.C. 154(b) by 0 days.

(21) Appl. No.: 15/060,696

(22) Filed: Mar. 4, 2016

(65) Prior Publication Data
US 2016/0189981 A1 Jun. 30, 2016

Related U.S. Application Data

(62) Division of application No. 13/689,207, filed on Nov. 29, 2012, now Pat. No. 9,301,391.

(Continued)

(51) Int. Cl.
*H01L 21/48* (2006.01)
*H01L 21/02* (2006.01)
(Continued)

(52) U.S. Cl.
CPC .......... *H01L 21/4857* (2013.01); *C25D 5/022* (2013.01); *C25D 7/12* (2013.01);
(Continued)

(58) Field of Classification Search
CPC ........... H01L 21/6835; H01L 23/49861; H01L 24/13; H01L 24/16; H01L 21/2885; H01L 23/49838; C25D 7/12
(Continued)

(56) References Cited

U.S. PATENT DOCUMENTS 5,248,854 A 9/1993 Kudoh et al.
5,481,798 A 1/1996 Ohsawa et al.
(Continued)

FOREIGN PATENT DOCUMENTS

CN 100437987 C 11/2008
CN 102132404 A 7/2011
JP 2008-153622 A 7/2008

OTHER PUBLICATIONS

Taiwanese Office Action dated Sep. 24, 2014.
Chinese Office Action dated Jan. 21, 2015 English translation.
Chinese Office Action dated Aug. 10, 2015.

*Primary Examiner* — Thomas L Dickey
*Assistant Examiner* — Changhyun Yi
(74) *Attorney, Agent, or Firm* — Rabin & Berdo, P.C.

(57) ABSTRACT

A manufacturing method of a substrate structure is provided. The method includes the following steps. Firstly, a conductive carrier is provided. Then, a first metal layer is formed on the conductive carrier. Then, a second metal layer is formed on the first metal layer. Then, a third metal layer is formed on the second metal layer, wherein each of the second metal layer and the third metal layer has a first surface and a second surface opposite to the first surface, the first surface of the third metal layer is connected to the second surface of the second metal layer, the surface area of the first surface of the third metal layer is larger than the surface area of the second surface of the second metal layer, and the first metal layer, the second metal layer and the third metal layer form a conductive structure.

14 Claims, 11 Drawing Sheets

Related U.S. Application Data

(60) Provisional application No. 61/564,329, filed on Nov. 29, 2011.

(51) Int. Cl.

| | | |
|---|---|---|
| *H01L 23/48* | (2006.01) |
| *H05K 1/03* | (2006.01) |
| *H05K 1/09* | (2006.01) |
| *H01L 23/498* | (2006.01) |
| *C25D 5/02* | (2006.01) |
| *C25D 7/12* | (2006.01) |
| *H01L 21/027* | (2006.01) |
| *H01L 21/288* | (2006.01) |
| *H01L 23/31* | (2006.01) |
| *H01L 23/00* | (2006.01) |

(52) U.S. Cl.
CPC .... *H01L 21/0273* (2013.01); *H01L 21/02697* (2013.01); *H01L 21/2885* (2013.01); *H01L 21/486* (2013.01); *H01L 23/48* (2013.01); *H01L 23/49838* (2013.01); *H01L 23/49861* (2013.01); *H01L 23/49866* (2013.01); *H01L 23/49894* (2013.01); *H05K 1/0373* (2013.01); *H05K 1/09* (2013.01); *H05K 1/092* (2013.01); *H01L 23/3107* (2013.01); *H01L 24/73* (2013.01); *H01L 2224/16225* (2013.01); *H01L 2224/32225* (2013.01); *H01L 2224/48227* (2013.01); *H01L 2224/73204* (2013.01); *H01L 2224/73265* (2013.01); *H05K 2201/09118* (2013.01); *H05K 2203/0574* (2013.01)

(58) Field of Classification Search
USPC ................ 438/121, 627, 634, 687, 653, 654
See application file for complete search history.

(56) References Cited

U.S. PATENT DOCUMENTS

| | | |
|---|---|---|
| 6,294,840 B1 | 9/2001 | McCormick |
| 6,563,202 B1 | 5/2003 | Ohsawa et al. |
| 7,365,441 B2 | 4/2008 | Ikenaga et al. |
| 7,474,538 B2 | 1/2009 | Kikuchi et al. |
| 8,310,060 B1 | 11/2012 | Nondhasittichai et al. |
| 8,865,525 B2 | 10/2014 | Lin et al. |
| 8,866,301 B2 | 10/2014 | Lin et al. |
| 2001/0010945 A1 | 8/2001 | Miyazaki |
| 2002/0025607 A1 | 2/2002 | Danno et al. |
| 2002/0037647 A1 | 3/2002 | Hwang et al. |
| 2002/0168542 A1 | 11/2002 | Izbicki et al. |
| 2003/0045024 A1 | 3/2003 | Shimoto et al. |
| 2003/0057568 A1 | 3/2003 | Miyazaki |
| 2003/0064671 A1 | 4/2003 | Pasqualoni et al. |
| 2003/0232205 A1 | 12/2003 | Tsukaguchi et al. |
| 2005/0088833 A1 | 4/2005 | Kikuchi et al. |
| 2006/0189141 A1 | 8/2006 | Mahlkow et al. |
| 2006/0292851 A1* | 12/2006 | Lin ................. H01L 24/13 438/618 |
| 2007/0120229 A1 | 5/2007 | Sakayori et al. |
| 2007/0281471 A1 | 12/2007 | Hurwitz et al. |
| 2009/0046441 A1* | 2/2009 | Funaya ............. H01L 21/6835 361/783 |
| 2009/0102043 A1 | 4/2009 | Jimmy et al. |
| 2009/0291530 A1 | 11/2009 | Jimmy et al. |
| 2010/0270668 A1* | 10/2010 | Marcoux ............. H01L 23/481 257/690 |
| 2011/0210442 A1 | 9/2011 | Lim et al. |
| 2012/0153463 A1 | 6/2012 | Maeda |
| 2012/0153466 A1 | 6/2012 | Chew et al. |
| 2013/0020710 A1 | 1/2013 | Chew et al. |
| 2013/0175707 A1 | 7/2013 | Chew et al. |

\* cited by examiner

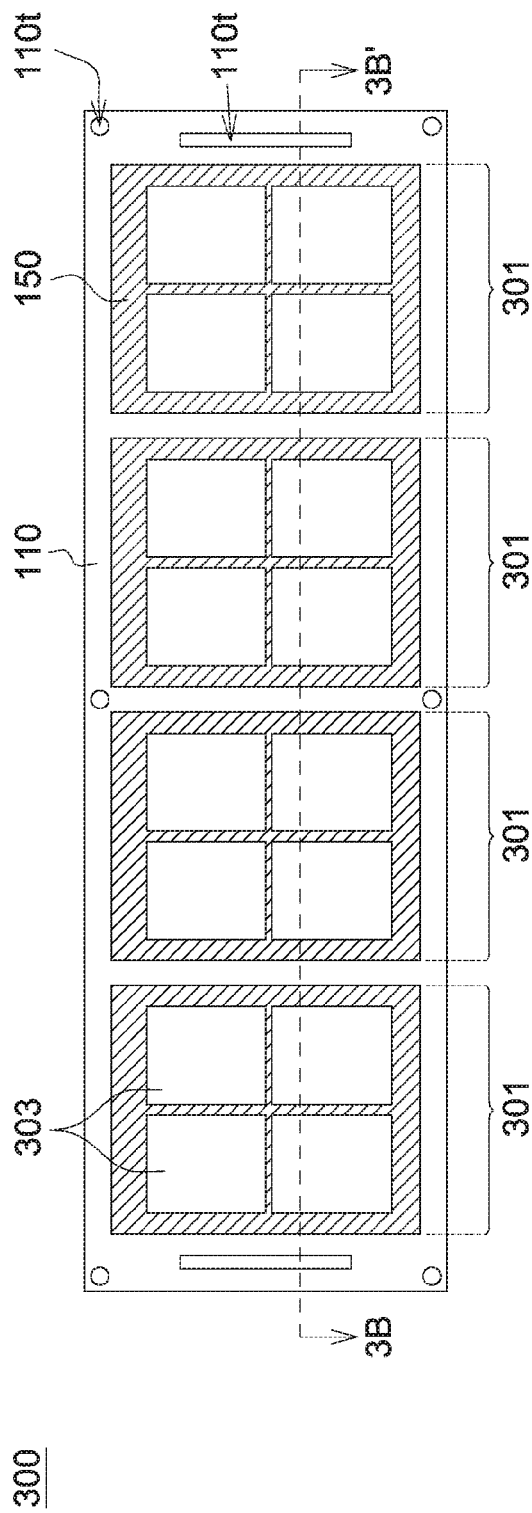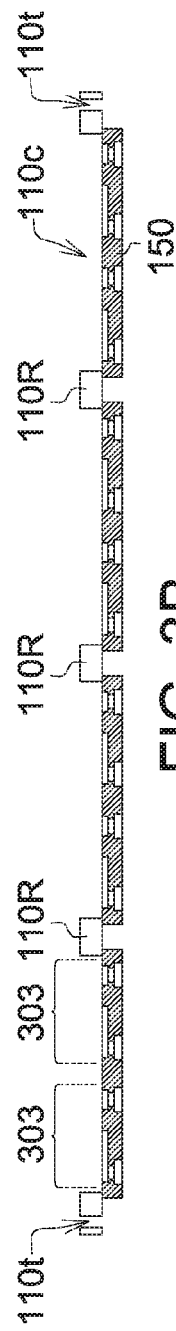

MANUFACTURING METHOD OF SUBSTRATE STRUCTURE HAVING EMBEDDED INTERCONNECTION LAYERS

This is a divisional application of U.S. application Ser. No. 13/689,207, filed Nov. 29, 2012, now in a state of allowability. This divisional application claims the benefit of U.S. provisional application Ser. No. 61/564,329, filed Nov. 29, 2011, the contents of which are incorporated herein by reference.

BACKGROUND OF THE INVENTION

Field of the Invention

The invention relates in general to a manufacturing method of a substrate structure.

Description of the Related Art

As the electronic products are widely used in people's everydayness, the demand for semiconductor elements is increasing. The design of semiconductor elements is directed towards slimness. As the size of semiconductor elements is reduced, the number of I/O pins is increased, not decreased, such that the circuit pitch and the circuit width need to be reduced, and the design of fine pitches as small as 50 μm or even smaller than 35 μm has thus come to the fore.

However, in the design of fine pitches, solder bridging may easily occur between neighboring traces, and the solder may even be overspread along traces. Therefore, how to resolve the above problems encountered in element miniaturization and simplify the packaging process has become a prominent task for the industries of semiconductor package device.

SUMMARY OF THE INVENTION

According to an embodiment of the present invention, a manufacturing method of substrate structure is provided. The manufacturing method of substrate structure comprises the following steps. A first metal layer is formed. A second metal layer is formed on the first metal layer. A third metal layer is formed on the second metal layer. Each of the second metal layer and the third metal layer has a first surface and a second surface opposite to the first surface. The first surface of the third metal layer is connected to the second surface of the second metal layer. The surface area of the first surface of the third metal layer is larger than that of the second surface of the second metal layer. The first metal layer, the second metal layer and the third metal layer form a conductive structure.

The above and other aspects of the invention will become better understood with regard to the following detailed description of the preferred but non-limiting embodiment(s). The following description is made with reference to the accompanying drawings.

BRIEF DESCRIPTION OF THE DRAWINGS

FIG. 3A shows a top view of a substrate structure according to an alternate embodiment of the invention;

FIG. 3B shows a cross-sectional view of the substrate structure of FIG. 3A along a cross-sectional line 3B-3B'.

DETAILED DESCRIPTION OF THE INVENTION

Figure 1A:
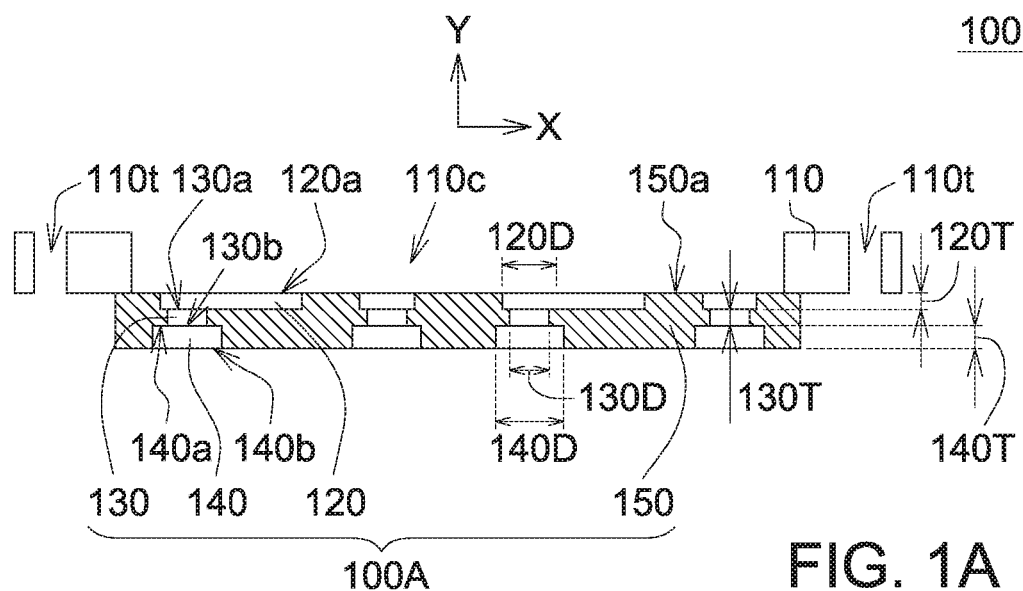
FIG. 1A shows a cross-sectional view of a substrate structure according to an embodiment of the invention.

Referring to FIG. 1A, a cross-sectional view of a substrate structure according to an embodiment of the invention is shown. The substrate structure 100 comprises a conductive structure 100A and a conductive carrier 110 disposed on the conductive structure 100A.

The conductive structure 100A comprises a first metal layer 120, a second metal layer 130 and a third metal layer 140. The second metal layer 130 is disposed on the first metal layer 120. The third metal layer 140 is disposed on the second metal layer 130. The second metal layer 130 has a first surface 130a and a second surface 130b opposite to the first surface 130a. The third metal layer 140 has a first surface 140a and a second surface 140b opposite to the first surface 140a. The first surface 140a of the third metal layer 140 is connected to the second surface 130b of the second metal layer 130. The surface area of the first surface 140a of the third metal layer 140 is larger than that of the second surface 130b of the second metal layer 130.

In an embodiment, the thickness 120T of the first metal layer 120 is about 20 μm. In an embodiment, the thickness 140T of the third metal layer 140 is larger than or equal to the thickness 130T of the second metal layer 130. The thickness 130T of the second metal layer 130 ranges between 20~50 μm, and preferably ranges between 20~30 μm. The thickness 140T of the third metal layer 140 ranges between 50~100 μm.

In an embodiment, each of the first metal layer 120 and the third metal layer 140 comprises at least one of copper, nickel, palladium or gold, and the second metal layer 130 comprises at least one of copper or nickel.

Figure 1B:
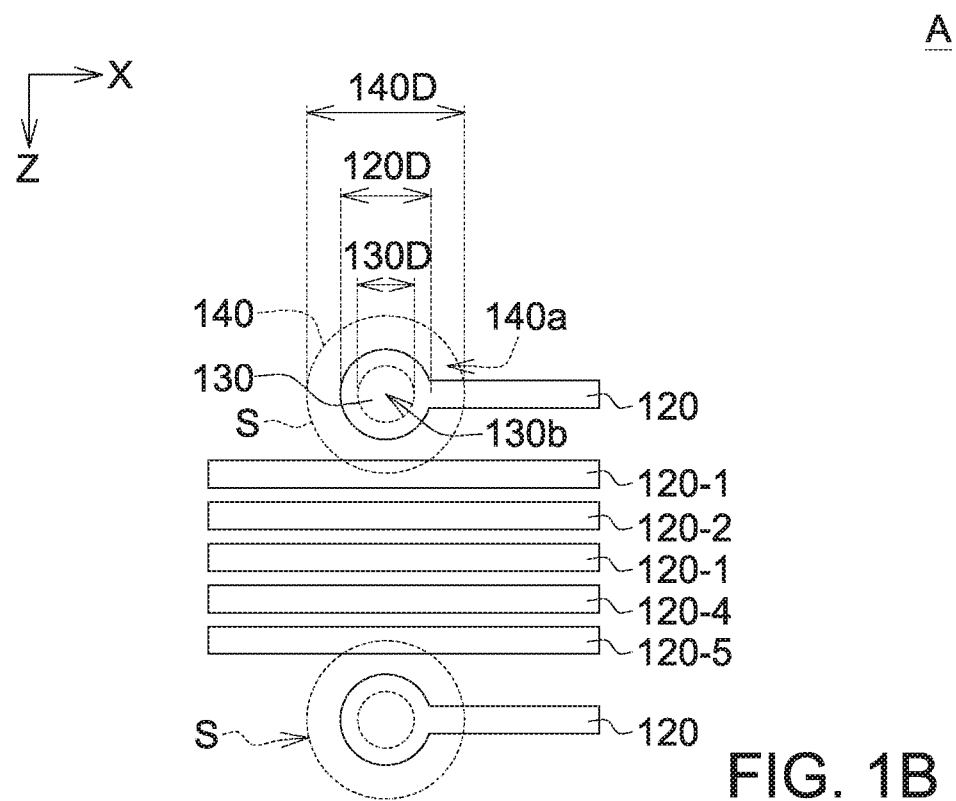
FIG. 1B shows a partial top view of a region A of FIG. 1A.

Referring to FIG. 1B, a partial top view of a region A of FIG. 1A is shown. In an embodiment, as indicated in FIG. 1B, the second surface 130b of the second metal layer 130 and the first surface 140a of the third metal layer 140 are substantially circular, the diameter 130D of the second surface 130b of the second metal layer 130 ranges between 20~100 μm, and the diameter 140D of the first surface 140a of the third metal layer 140 ranges between 200~300 μm. As indicated in FIG. 1B, the part of the first metal layer 120 coupled to the second metal layer 130 is substantially circular, and has a diameter 120D, which ranges between 80~100 μm. In an embodiment, the diameter 140D is larger than the diameter 130D, and the diameter 140D is larger than the diameter 120D.

As indicated in FIG. 1A, the conductive structure 100A further comprises a dielectric layer 150. The first metal layer 120, the second metal layer 130 and the third metal layer 140 are embedded in the dielectric layer 150, such that the metal layers 120, 130 and 140 will not be damaged by an etching solution in subsequent etching process. In an embodiment, the dielectric layer 150 comprises a thermosetting material and a silica filler.

In an embodiment, as indicated in FIG. 1A, the second surface 140b of the third metal layer 140 is exposed outside the dielectric layer 150 for electrically connecting to an external element. The part outside the second surface 140b of the third metal layer 140 is encapsulated by the dielectric layer 150. That is, the dielectric layer 150 defines the surface area of the second surface 140b, and avoids the metal layers 120, 130 and 140 being damaged in subsequent etching process. Meanwhile, in the subsequent process, when the metal layers 120, 130 and/or 140 are connected to the solder, the dielectric layer 150 can protect the metal layers 120, 130 and 140 without using a solder mask. That is, the dielectric layer 150 can have the function of a solder mask.

The substrate structure 100 has an active surface and a rear surface opposite to the active surface. The first metal layer 120 is formed by a plurality of traces. The traces form a trace pattern on the active surface of the substrate structure 100. Preferably, the second metal layer 130 has a plurality of micro-via holes completely embedded in the dielectric layer 150. The third metal layer 140 has a plurality of studs. At least one trace has a micro-via hole and a stud corresponding to the trace. The micro-via holes of the second metal layer 130 are for electrically connecting the traces of the first metal layer 120 to the studs of the third metal layer 140. The studs further electrically connect the traces to the rear surface of the substrate structure 100. A surface of the stud is exposed outside the dielectric layer 150 for electrically connecting to an external element.

As indicated in FIG. 1B, if the first metal layer 120 is directly formed on the third metal layer 140, then the surface area of the electrical connection terminal S is equal to that of the first surface 140a of the third metal layer 140. The large surface area of the terminal S incapacitates the formation of the metal traces 120-1 and 120-5 of FIG. 1B. Conversely, in an embodiment of the disclosure, the first metal layer 120 is electrically connected to the third metal layer 140 through the second metal layer 130, the first metal layer 120 is not directly formed on the third metal layer 140, and the size of the third metal layer 140 is larger than that of the second metal layer 130. For example, the surface area of the first surface 140a of the third metal layer 140 is larger than that of the second surface 130b of the second metal layer 130; or, the diameter 140D is larger than the diameter 130D. Meanwhile, the surface area of the part of the first metal layer 120 coupled to the second metal layer 130 (the electrical connection terminal) can be reduced to be equal to or slightly larger than that of the second surface 130b of the second metal layer 130. Therefore, there is sufficient space for forming the metal traces 120-1 and 120-5 of FIG. 1B, and more traces can be formed at the part between the electrical connection terminals (the part electrically connected to the second metal layer 130) of the first metal layer 120 (traces). Consequently, the trace density is increased, and trace design becomes more flexible.

In an embodiment, the conductive carrier 110 is such as a copper layer or a composite metal layer having a Cu exterior clad layer. The composite metal layer comprises an inner layer and a Cu exterior clad layer, wherein the thickness of the inner layer is larger than that of the Cu exterior clad layer. The inner layer such as comprises steel, or at least two of iron, carbon, magnesium, phosphorus, sulfur, chromium and nickel. The material of the Cu exterior clad layer is different from that of the inner layer, hence providing better isolation for etching. Furthermore, the use of the Cu exterior clad layer makes the conductive carrier 110 be used and operated as a complete copper layer, and reduces overall manufacturing cost. In addition, the coefficient of thermal expansion (CTE) of the inner layer is close to that of the package material used for encapsulating the semiconductor chip. Therefore, the semiconductor package device formed by using the conductive carrier 110 has fewer warpage, such that the surface area of the conductive carrier 110 is increased and more semiconductor package devices can be formed on the conductive carrier 110.

As indicated in FIG. 1A, in an embodiment, the surface area of the conductive carrier 110 is larger than that of the conductive structure 100A. In an embodiment, the conductive carrier 110 has an opening 110c exposing the top surface 120a of the first metal layer 120, and the conductive carrier 110 has a carrier ring surrounding the opening 110c. The carrier ring of the conductive carrier 110 is protruded from the peripheral of the conductive structure 100A. The carrier ring of the conductive carrier 110 surrounds the top surface 150a of the dielectric layer 150 for enhancing the strength of the substrate structure 100 to avoid the package unit being warped or deformed. Moreover, the semiconductor package device having the substrate structure 100 can be delivered through the carrier ring of the conductive carrier 110 without contacting the first metal layer 120 or the dielectric layer 150 to avoid the semiconductor package device being mechanically damaged.

In an embodiment, as indicated in FIG. 1A, the conductive carrier 110 has at least one through hole 110t formed in the ring structure (carrier ring). In an embodiment, the through hole 110t is a positioning hole for the semiconductor package device having the substrate structure 100, and can be used as a reference point for positioning the semiconductor package device.

Figure 2A:
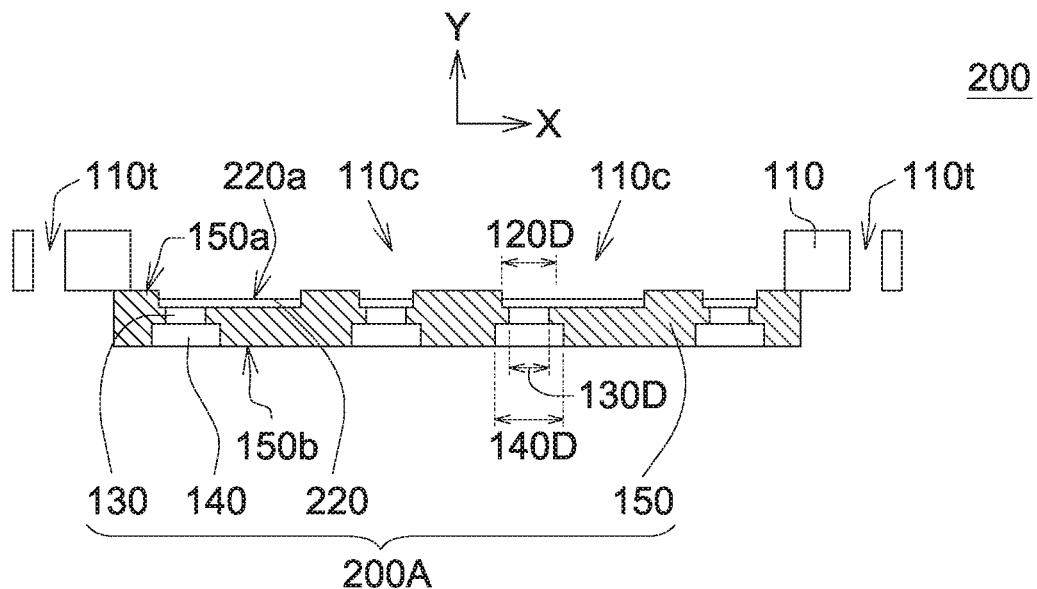
FIG. 2A shows a cross-sectional view of a substrate structure according to another embodiment of the invention.
Figure 2B:
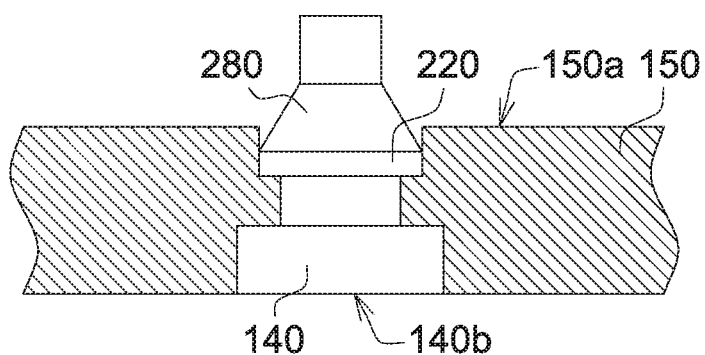
FIG. 2B shows a partial cross-sectional view of the first metal layer FIG. 2A being bonded to a contact pad.

Referring to FIGS. 2A~2B. FIG. 2A shows a cross-sectional view of a substrate structure according to another embodiment of the invention. FIG. 2B shows a partial cross-sectional view of the first metal layer FIG. 2A being bonded to a contact pad. The present embodiment of the invention is different from the embodiment of FIG. 1A in that: in the semiconductor structure 200, the top surface 220a of the first metal layer 220 of the conductive structure 200A is exposed outside the dielectric layer 150 and recessed corresponding to the top surface 150a of the dielectric layer 150. As indicated in FIG. 2B, when the surface 220a is recessed corresponding to the top surface 150a of the dielectric layer 150, the solder 280 is partly or completely embedded in the recess of the dielectric layer 150, such that two opposite sides of the solder 280 are individually restricted in the recess by the sidewalls of the dielectric layer 150 and cannot move around. Consequently, the solder 280 (such as solder tin) reflowed at a high temperature will not be bridged and short-circuited. In an embodiment, the second surface 140b of the third metal layer 140 can also be recessed corresponding to the bottom surface 150b of the dielectric layer 150 (the bottom surface 150b is not illustrated in the diagram) for fixing the solder ball 575 (Referring to FIG. 5) on the third metal layer 140, such that the implantation quality is more stable.

Referring to FIGS. 3A~3B. FIG. 3A shows a top view of a substrate structure according to an alternate embodiment of the invention. FIG. 3B shows a cross-sectional view of the substrate structure of FIG. 3A along a cross-sectional line 3B-3B'.

The substrate structure 300 comprises a conductive carrier ring 110 and four packaging units 301. The conductive carrier ring 110 has four openings 110c separated by ribs 110R. Each opening 110c correspondingly exposes a packaging unit 301. Each packaging unit 301 is such as divided into four element blocks 303. Preferably, each of the element blocks 303 has the same pattern and is formed by a plurality of traces. The four element blocks 303 are encapsulated by the dielectric layer 150, and the peripheral of each packaging unit 301 is interconnected by the ribs 110R to avoid the package unit being warped or deformed.

In an embodiment, the conductive carrier ring 110 also has a plurality of through holes 110t in the ring structure (carrier ring). As indicated in FIG. 3A, the circular through holes 110t at the four corners of the conductive carrier ring 110 can be used as reference points for positioning the semiconductor package device, and the groove type through holes 110t located on two sides of the conductive carrier ring 110 can be used for relieving the stress of the substrate structure 300.

Figure 4A:
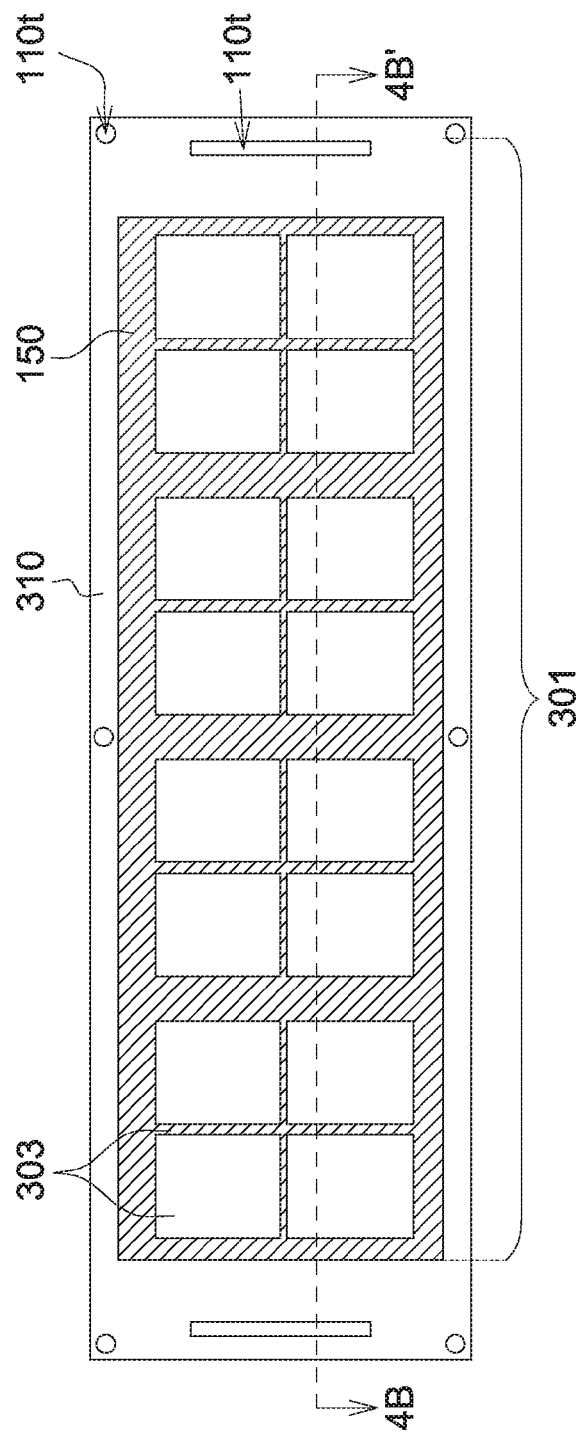
FIG. 4A shows e a top view of a substrate structure according to another alternate embodiment of the invention.
Figure 4B:
FIG. 4B shows a cross-sectional view of the substrate structure of FIG. 4A along a cross-sectional line 4B-4B'.

Referring to FIGS. 4A~4B. FIG. 4A shows a top view of a substrate structure according to another alternate embodiment of the invention. FIG. 4B shows a cross-sectional view of the substrate structure of FIG. 4A along a cross-sectional line 4B-4B'. The embodiment of FIGS. 4A~4B is different from the embodiment of FIGS. 3A~3B in that: in the substrate structure 400, the conductive carrier ring 310 has a larger opening 310c correspondingly exposing a packaging units 301, each packaging unit 301 is such as divided into 16 element blocks 303 encapsulated by the dielectric layer 150a, and the outmost peripherals of the four packaging units 301 are connected to the conductive carrier ring 310 to avoid the package unit being warped or deformed.

Figure 5:
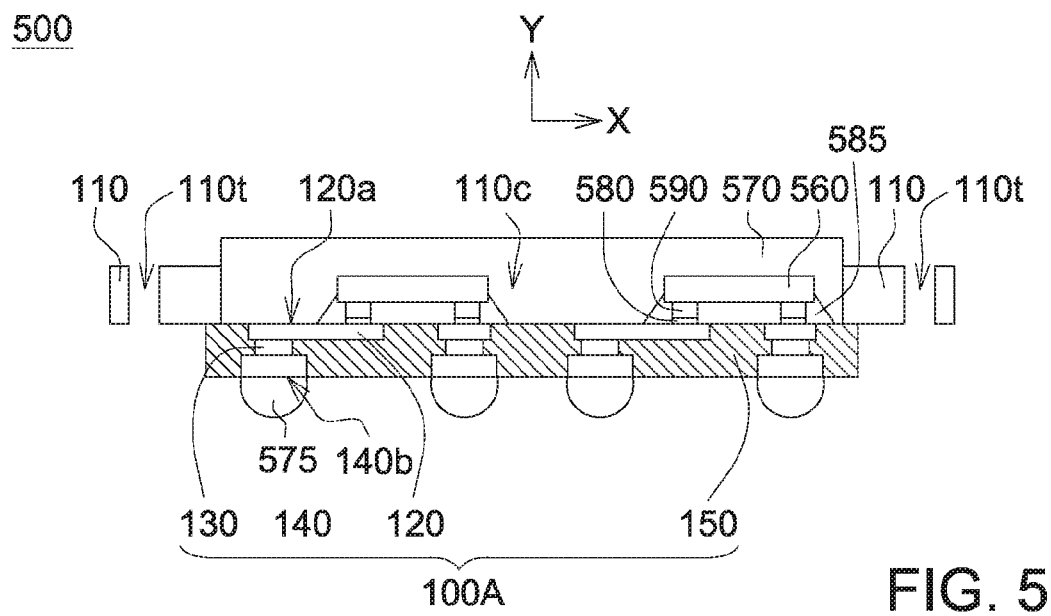
FIG. 5 shows a cross-sectional view of a semiconductor package device according to an embodiment of the invention.
Figure 6:
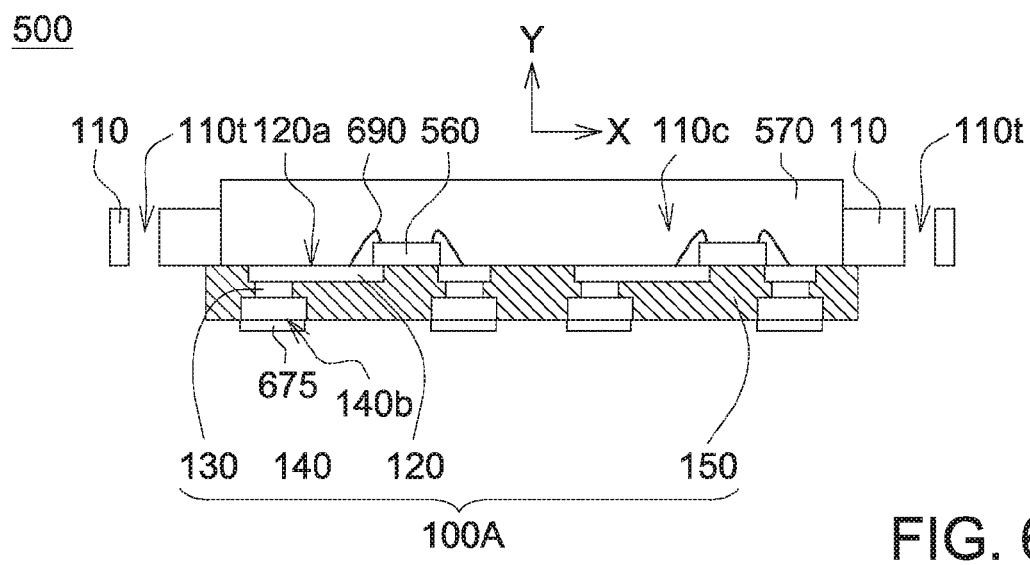
FIG. 6 shows a cross-sectional view of a semiconductor package device according to another embodiment of the invention.

Referring to FIGS. 5~6. FIG. 5 shows a cross-sectional view of a semiconductor package device according to an embodiment of the invention. FIG. 6 shows a cross-sectional view of a semiconductor package device according to another embodiment of the invention.

As indicated in FIGS. 5~6, the semiconductor package device 500/600 comprises a conductive structure 100A, a conductive carrier 110 and a semiconductor chip 560. The conductive carrier 110 is disposed on the conductive structure 110A. The conductive carrier 110 has an opening 110c exposing the top surface 120a of the first metal layer 120. The semiconductor chip 560 is disposed in the opening 110c and electrically connected to the first metal layer 120. In an embodiment, the semiconductor package device 500/600 may further comprise a connection element for electrically connecting the semiconductor chip 560 to the first metal layer 120. In addition, the semiconductor package device 500/600 further comprises an encapsulating layer 570 encapsulating the semiconductor chip 560 and the connection element. Details of the description of the conductive structure 110A are as disclosed in the above embodiments, and the similarities are not repeated here.

As indicated in FIG. 5, the connection element is such as a solder 580 and a column stud 590 (pillar bump). The semiconductor chip 560 is electrically connected to the first metal layer 120 through the solder 580 and the column stud 590. The encapsulating layer 570 encapsulates the semiconductor chip 560, the solder 580 and the column stud 590. Besides, the semiconductor package device 500 further comprises a solder ball 575 or a solder paste (not illustrated), and the second surface 140b of the third metal layer 140 is electrically connected to an external element through the solder ball 575 or the solder paste. Moreover, the semiconductor package device 500 further comprises the underfill 585 encapsulating the connection element.

As indicated in FIG. 6, the connection element is such as a bonding wire 690 through which the semiconductor chip 560 is electrically connected to the first metal layer 120. The encapsulating layer 570 encapsulates the semiconductor chip 560 and the bonding wire 690. Besides, the semiconductor package device 600 further comprises a solder pad 675 through which the second surface 140b of the third metal layer 140 is electrically connected to an external element.

Furthermore, the package structure having two semiconductor elements is cut along a cutting line to form single semiconductor elements. In the cutting process, the conductive carrier ring 110 is removed (not illustrated).

Figure 7A:
FIGS. 7A~7T are processes of a flowchart of a manufacturing method of substrate structure according to an embodiment of the invention.
Figure 7B:
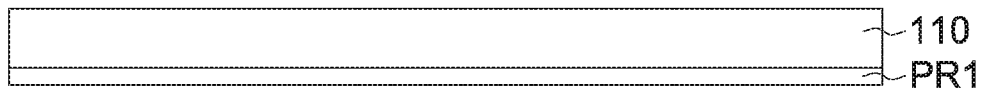
Figure 7C:
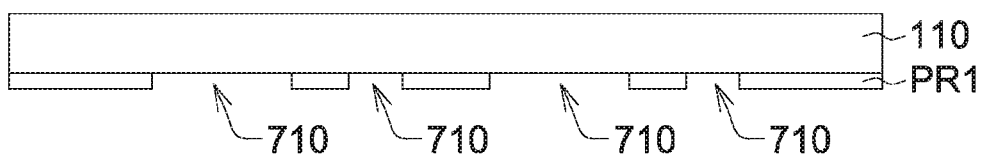
Figure 7D:
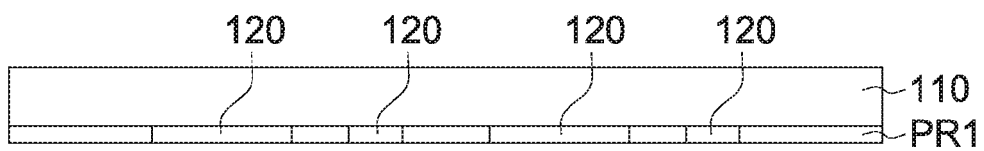
Figure 7E:
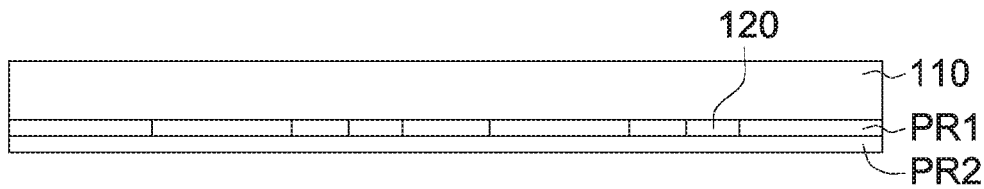
Figure 7F:
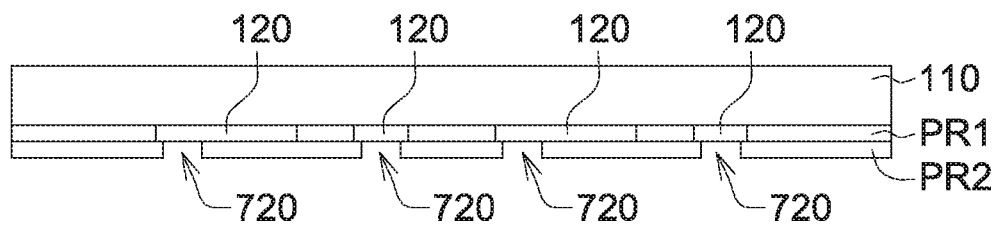
Figure 7G:
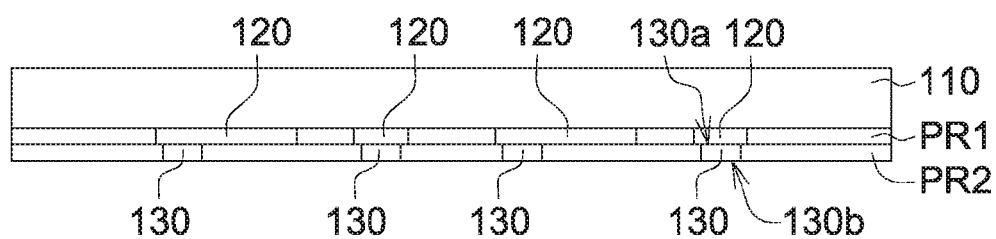
Figure 7H:
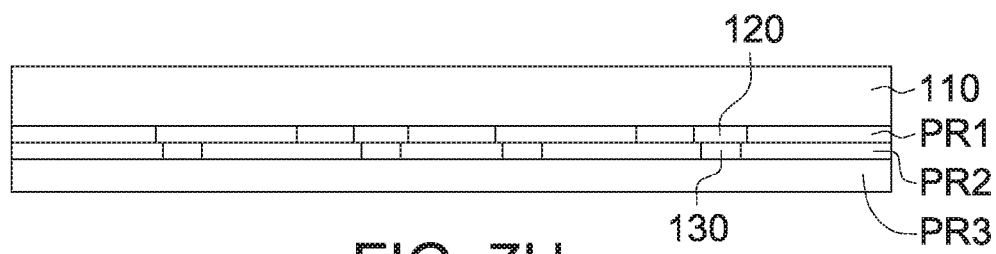
Figure 7I:
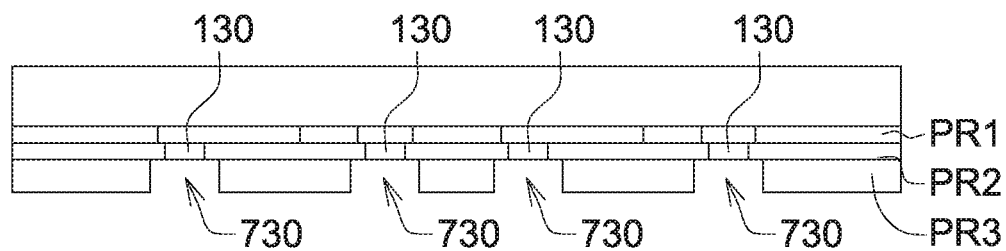
Figure 7J:
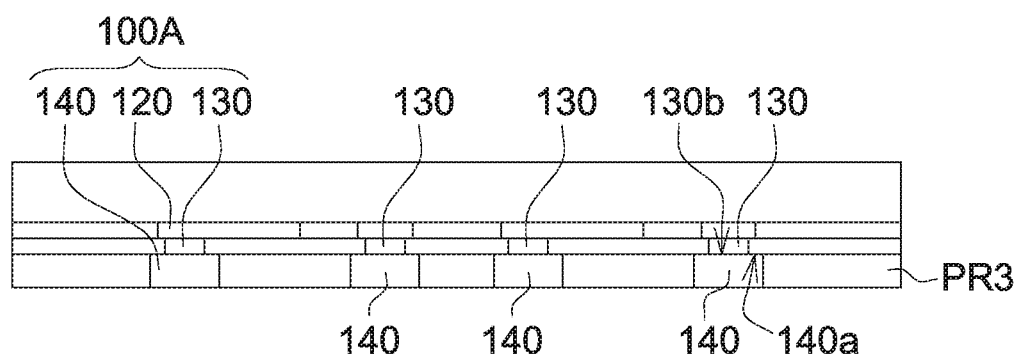
Figure 7K:
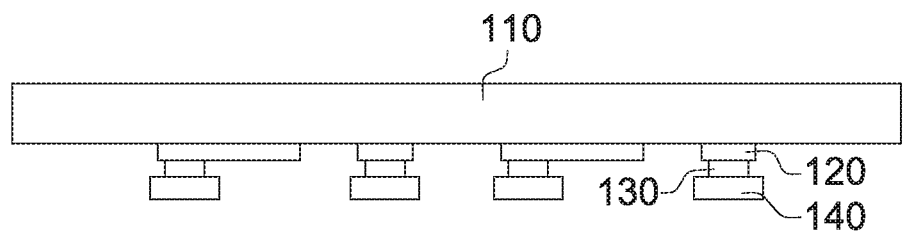
Figure 7L:
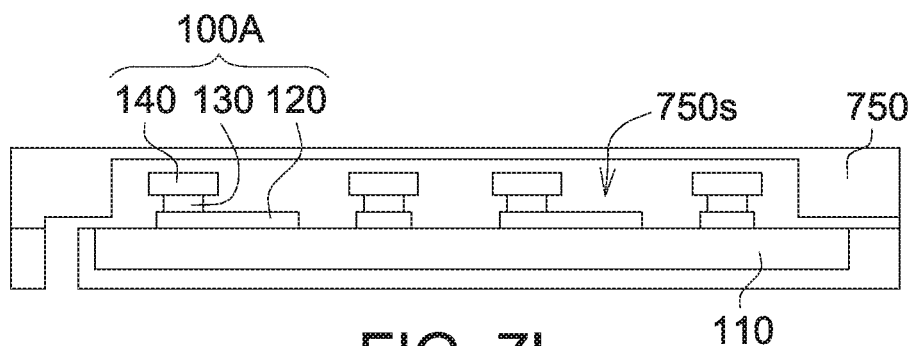
Figure 7M:
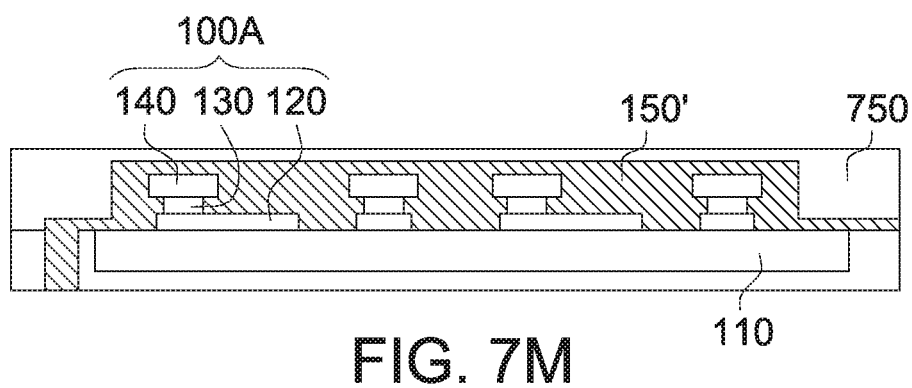
Figure 7N:
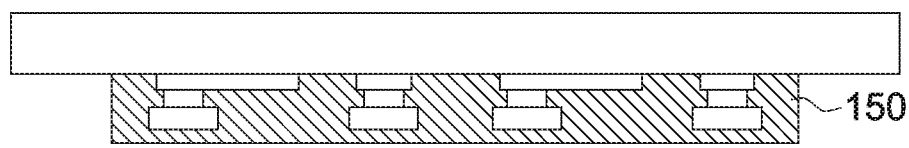
Figure 7O:
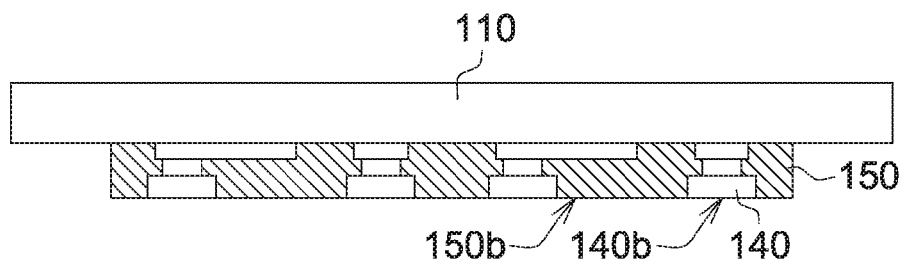
Figure 7P:
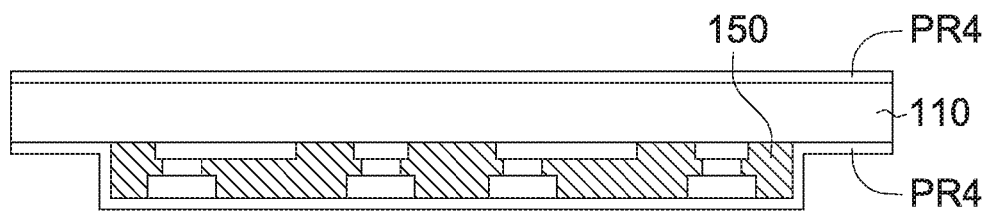
Figure 7Q:
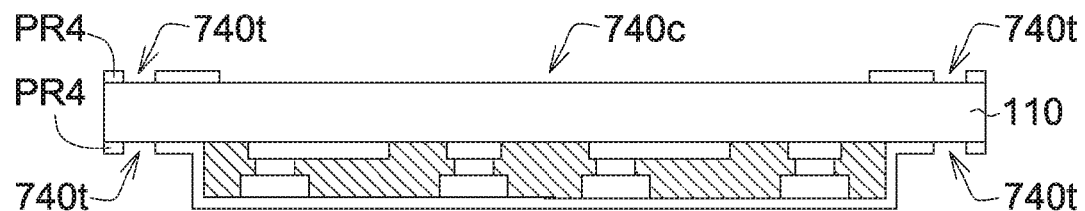
Figure 7R:
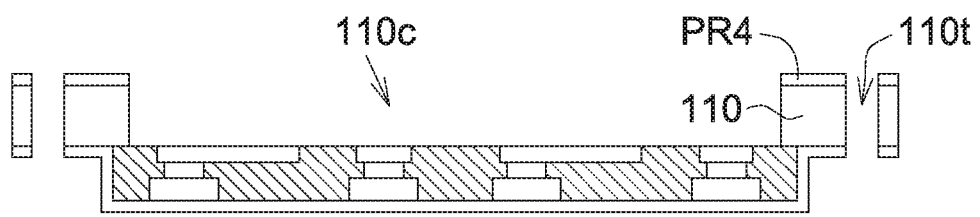
Figure 7S:
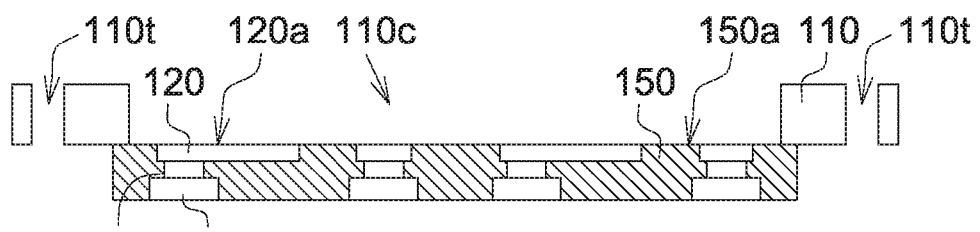
Figure 7T:
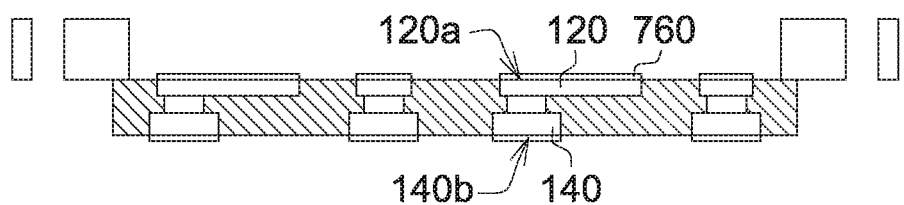

Referring to FIGS. 7A~7T, processes of a flowchart of a manufacturing method of substrate structure according to an embodiment of the invention are shown.

Referring to FIG. 7A, a conductive carrier 110 is provided. The material of the conductive carrier 110 is the same as the disclosure in the above embodiments, and the similarities are not repeated here.

Referring to FIG. 7B~7D, a first metal layer 120 is formed.

In an embodiment, the formation of the first metal layer 120 comprises the following steps: A conductive carrier 110 is provided. A first photoresist layer PR1 is formed on the conductive carrier 110 as indicated in FIG. 7B. A first photoresist layer PR1 is patterned to form a plurality of first opening 710 exposing a part of the conductive carrier 110 as indicated in FIG. 7C. A first metal layer 120 is formed in the first opening 710 as indicated in FIG. 7D. Thus, the line width and the line spacing of the first metal layer 120 can achieve 10 μm level.

In another embodiment, the formation of the first metal layer (not illustrated) is as follows. A copper layer is formed on the conductive carrier 110. A photoresist layer is formed on the copper layer. The photoresist layer is patterned to form a predetermined pattern of the first metal layer. A part of the copper layer exposed outside the photoresist layer is etched. The photoresist layer is removed to form the first metal layer.

In practical application, the manufacturing process for forming the first metal layer is selected according to actual needs and is not limited to the above exemplification.

In an embodiment, the first opening 710 is formed by such as etching, the first metal layer 120 is formed by such as electroplating, and the first metal layer 120 comprises at least one of copper, nickel, palladium or gold and directly contacts the conductive carrier 110.

Then, referring to FIGS. 7E~7G, a second metal layer 130 is formed.

In an embodiment, the formation of the second metal layer 130 comprises the following steps: A second photoresist layer PR2 is formed on the first photoresist layer PR1 and the first metal layer 120 as indicated in FIG. 7E. A second photoresist layer PR2 is patterned to form a plurality of second openings 720 exposing a part of the first metal layer 120 as indicated in FIG. 7F. A second metal layer 130 is formed in the second opening 720 as indicated in FIG. 7G. In an embodiment, each part of the first metal layer 120 at least corresponds to a second opening 720 as indicated in FIG. 7F.

In an embodiment, as indicated in FIG. 7G, each part of the first metal layer 120 is at least corresponding and connected to a part of the second metal layer 130. The surface of each part of the second metal layer 130 (the first surface 130a and the second surface 130b) is such as circular, the diameter ranges between 20~100 μm, and each part of the second metal layer 130 is such as cylindrical. The second metal layer 130 directly contacts the first metal layer 120. In an embodiment, the second metal layer 130 is formed on the first metal layer 120 by such as electroplating. The second metal layer 130 comprises at least one of copper or nickel, and the thickness of the second metal layer 130 ranges between 20~50 μm.

Then, referring to FIGS. 7H~7J, a third metal layer 140 is formed.

In an embodiment, the formation of the third metal layer 140 comprises the following steps: A third photoresist layer PR3 is formed on the second photoresist layer PR2 and the second metal layer 130 as indicated in FIG. 7H. A third photoresist layer PR3 is patterned to form a plurality of third openings 730 exposing the second metal layer 130 as indicated in FIG. 7I. A third metal layer 140 is formed in the third opening 730 as indicated in FIG. 7J.

In an embodiment, as indicated in FIG. 7I, each part of the second metal layer 130 at least corresponds to a third opening 730. The size of the third opening 730 is larger than that of the second metal layer 130. The third opening 730 exposes the entire surface 130b of the second metal layer 130 and a part of the second photoresist layer PR2.

In an embodiment, as indicated in FIG. 7J, each part of the second metal layer 130 is at least corresponding and connected to a part of the third metal layer 140. The size of the third metal layer 140 is larger than that of the second metal layer 130. The third metal layer 140 covers the entire surface 130b of the second metal layer 130 and a part of the second photoresist layer PR2. The first surface 140a of the third metal layer 140 directly contacts the second surface 130b of the second metal layer 130, and the surface area of the first surface 140a of the third metal layer 140 is larger than that of the second surface 130b of the second metal layer 130.

In an embodiment, the third metal layer 140 is formed by such as an electroplating process and comprises at least one of copper, nickel, palladium or gold. The thickness of the third metal layer 140 is larger than or equal to that of the second metal layer 130. Up to here, the first metal layer 120, the second metal layer 130 and the third metal layer 140 form a conductive structure 100A.

Then, referring to FIG. 7K, the first photoresist layer PR1, the second photoresist layer PR2 and the third photoresist layer PR3 are removed. In an embodiment, the photoresist layers PR1, PR2 and PR3 are removed at the same time by such as etching. After the photoresist layers PR1, PR2 and PR3 are removed, the conductive carrier 110, the first metal layer 120, the second metal layer 130 and the third metal layer 140 are exposed.

In another embodiment, the formation of the second metal layer and the third metal layer (not illustrated) as follows: A second photoresist layer is formed on the first photoresist layer and the first metal layer. A second photoresist layer is patterned to form a plurality of second openings exposing the first metal layer. A third photoresist layer is formed on the second photoresist layer and patterned to form a plurality of third openings exposing a part of the second photoresist layer and the first metal layer. A second metal layer and a third metal layer are formed at the same time in the second opening and the third opening respectively. The manufacturing method of the present embodiment of the invention is different from the manufacturing method of FIGS. 7E~7J in that: after the second photoresist layer PR2 is formed, the second metal layer is not formed and the second photoresist layer PR3 is directly formed instead. Meanwhile, each second opening 720 and each third opening 730 are connected, and then the second metal layer 130 and the third metal layer 140 together are respectively formed in the second opening 720 and the third opening 730 connected to each other.

Then, referring to FIG. 7L~7N, the dielectric layer 150, the first metal layer 120, the second metal layer 130 and the third metal layer 140 are formed and embedded in the dielectric layer 150.

In an embodiment, the formation of the dielectric layer 150 comprises the following steps: A conductive structure 100A (the first metal layer 120, the second metal layer 130 and the third metal layer 140) is formed in the cavity 750s of the mold 750 as indicated in FIG. 7L. A liquid thermosetting material 150' is introduced into the cavity 750s for encapsulating the conductive structure 100A (the first metal layer 120, the second metal layer 130 and the third metal layer 140) as indicated in FIG. 7M. The liquid thermosetting material 150' is cured to form the dielectric layer 150 as indicated in FIG. 7N. Lastly, the mold 750 is removed.

In an embodiment, the liquid thermosetting material 150' is introduced into the mold 750 under the conditions of high temperature and high pressure. In an embodiment, before the thermosetting material 150' is introduced into the mold 750, surface treatment is applied to the surface of the conductive structure 100A (the first metal layer 120, the second metal layer 130 and the third metal layer 140) by such as chemical treatment or plasma treatment for increasing the adhesion between the surface and the dielectric layer 150.

When the dielectric layer is formed by lamination, the operating pressure may easily cause damage to delicate metal structure. In the present embodiment, the thermosetting material 150' is heated and becomes liquid through the transfer molding process. Then, the liquid thermosetting material 150' is introduced into the cavity 750s of the mold 750 under the conditions of high temperature and high pressure without causing damage to the structure of the first metal layer 120, the second metal layer 130 and the third metal layer 140. Since the thermosetting material 150' introduced into the cavity 750s of the mold 750 is in a liquid state, the liquid thermosetting material 150' can completely encapsulate the first metal layer 120, the second metal layer 130 and the third metal layer 140. Since the thermosetting material 150' in a liquid state does not damage the structure even when the operating pressure is high, the high pressure state can be used to suppress the generation of gas, and excellent adhesion between the dielectric layer 150 and the first metal layer 120, the second metal layer 130 and the third metal layer 140 can thus be achieved. Besides, the transfer molding process under high temperature provides excellent tightness between the dielectric layer 150 and the metal layers 120, 130 and 140, such that the metal layers 120, 130 and 140 will not be damaged in subsequent etching process.

In an embodiment, the dielectric layer 150 comprises a thermosetting material and a silica filler.

Then, referring to FIG. 7O, a part of the dielectric layer 150 is removed to expose the second surface 140b of the third metal layer 140. In an embodiment, a part of the dielectric layer 150 is removed by such as mechanical grinding or polishing for completely exposing the second surface 140b of the third metal layer 140.

In an embodiment, a part of the third metal layer 140 is removed by mechanical grinding or polishing, such that the expose second surface 140b is even smoother.

In an embodiment, the second surface 140b of the third metal layer 140 can be etched, such that the second surface 140b of the third metal layer 140 is recessed corresponding to the bottom surface 150b (not illustrated) of the dielectric layer 150.

Then, referring to FIGS. 7P~7S, the conductive carrier 110 is etched to form an opening 110c exposing the top surface 120a of the first metal layer 120. The conductive carrier 110 has a carrier ring surrounding the opening 110c.

In an embodiment, the step of forming the opening 110c by etching the conductive carrier 110 is as follows: A fourth photoresist layer PR4 is formed on the conductive carrier 110 and the dielectric layer 150 as indicated in FIG. 7P. The fourth photoresist layer PR4 is patterned to form opening 740c exposing a part of the conductive carrier 110 as indicated in FIG. 7Q. The conductive carrier 110 is etched according to the patterned fourth photoresist layer PR4 to form the opening 110c as indicated in FIG. 7R. The fourth photoresist layer PR4 is removed.

In an embodiment, the opening 110c exposes the top surface 120a of the first metal layer 120 and the top surface 150a of the dielectric layer 150.

Referring to FIG. 7P~7S. The conductive carrier 110 is etched at the same time to form at least one through hole 110t in the ring structure (carrier ring) of the conductive carrier 110.

In an embodiment, the step of forming the through hole 110t by etching the conductive carrier 110 is as follows: A fourth photoresist layer PR4 is formed on the conductive carrier 110 and the dielectric layer 150 as indicated in FIG. 7P. The fourth photoresist layer PR4 is patterned to form opening 740t exposing a part of the conductive carrier 110 as indicated in FIG. 7Q. The conductive carrier 110 is etched according to the patterned fourth photoresist layer PR4 to form opening 110t as indicated in FIG. 7R. The fourth photoresist layer PR4 is removed.

In an embodiment, the top surface 120a of the first metal layer 120 can be etched, such that the top surface 120a of the first metal layer 120 is recessed corresponding to the top surface 150a of the dielectric layer 150 (FIG. 2A).

Then, referring to FIG. 7T, a surface finishing layer 760 can be formed on the exposed surface 120a of the first metal layer 120 and the second surface 140b of the third metal layer 140.

In an embodiment, the surface finishing layer 760 is formed by such as electroplating, electroless plating or immersion. The surface finishing layer 760 comprises at least one of copper, nickel, palladium, gold, silver and tin.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A manufacturing method of substrate structure, comprising:
   providing a conductive carrier;
   forming a first photoresist layer on the conductive carrier, wherein the first photoresist layer is patterned to form a plurality of first openings exposing the conductive carrier;
   forming a first metal layer in the plurality of first openings;
   forming a second photoresist layer on the first photoresist layer and the first metal layer, wherein the second photoresist layer is patterned to form a plurality of second openings exposing the first metal layer;
   forming a second metal layer in the plurality of second openings; and
   forming a third metal layer on the second metal layer;
   wherein each of the second metal layer and the third metal layer has a first surface and a second surface opposite the first surface, the first surface of the third metal layer is connected to the second surface of the second metal layer, and a surface area of the first surface of the third metal layer is larger than a surface area of the second surface of the second metal layer.

2. The manufacturing method of substrate structure according to claim 1, wherein the second metal layer comprises at least one of copper or nickel.

3. The manufacturing method of substrate structure according to claim 1, wherein a thickness of the third metal layer is larger than or equal to a thickness of the second metal layer.

4. The manufacturing method of substrate structure according to claim 1, wherein each of the first metal layer and the third metal layer comprises at least one of copper, nickel, palladium or gold.

5. The manufacturing method of substrate structure according to claim 1, wherein the first metal layer, the second metal layer and the third metal layer is formed by an electroplating process.

6. The manufacturing method of substrate structure according to claim 1, wherein the step of forming the third metal layer comprises:
   forming a third photoresist layer on the second photoresist layer and the second metal layer, wherein the third photoresist layer is patterned to form a plurality of third openings exposing the second metal layer;
   forming the third metal layer in the third openings.

7. The manufacturing method of substrate structure according to claim 6, further comprising:
   removing the first photoresist layer, the second photoresist layer and the third photoresist layer.

8. A manufacturing method of substrate structure, comprising:
   providing a conductive carrier;
   forming a first photoresist layer on the conductive carrier, wherein the first photoresist layer is patterned to form a plurality of first openings exposing the conductive carrier;
   forming a first metal layer in the plurality of first openings;
   forming a second photoresist layer on the first photoresist layer and the first metal layer, wherein the second photoresist layer is patterned to form a plurality of second openings exposing the first metal layer;
   forming a third photoresist layer on the second photoresist layer, wherein the third photoresist layer is patterned to form a plurality of third openings exposing the plurality of second openings and a part of the second photoresist layer
   forming a second metal layer and a third metal layer in the plurality of second openings and the plurality of third openings at the same time; and
   removing the first photoresist layer, the second photoresist layer and the third photoresist layer, wherein the first metal layer, the second metal layer and the third metal layer form a conductive structure on the conductive carrier;
   wherein each of the second metal layer and the third metal layer has a first surface and a second surface opposite the first surface, the first surface of the third metal layer is connected to the second surface of the second metal layer, and a surface area of the first surface of the third metal layer is larger than a surface area of the second surface of the second metal layer.

9. The manufacturing method of substrate structure according to claim 1 or claim 8, further comprising:
forming a dielectric layer to encapsulate the first metal layer, the second metal layer and the third metal layer.

10. The manufacturing method of substrate structure according to claim 9, wherein the step of forming the dielectric layer comprises:
disposing the conductive structure in a cavity of a mold;
introducing a thermosetting material into the cavity to cover the conductive structure; and
curing the thermosetting material to form the dielectric layer.

11. The manufacturing method of substrate structure according to claim 9, further comprising:
removing a part of the dielectric layer to expose the second surface of the third metal layer.

12. The manufacturing method of substrate structure according to claim 11, further comprising:
etching the second surface of the third metal layer, such that the second surface of the third metal layer is recessed corresponding to a bottom surface of the dielectric layer.

13. The manufacturing method of substrate structure according to claim 9, further comprising:
etching the conductive carrier to expose a surface of the first metal layer.

14. The manufacturing method of substrate structure according to claim 13, further comprising:
etching the surface of the first metal layer, such that the surface of the first metal layer is recessed corresponding to a to surface of the dielectric layer.

* * * * *